(12) United States Patent
Dray et al.

(10) Patent No.: US 7,489,559 B2
(45) Date of Patent: Feb. 10, 2009

(54) RECURSIVE DEVICE FOR SWITCHING OVER A HIGH POTENTIAL GREATER THAN A NOMINAL POTENTIAL OF A TECHNOLOGY IN WHICH THE DEVICE IS MADE AND RELATED SYSTEM AND METHOD

(75) Inventors: Cyrille Dray, Grenoble (FR); Stéphane Gamet, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 93 days.

(21) Appl. No.: 11/643,009

(22) Filed: Dec. 19, 2006

(65) Prior Publication Data
US 2007/0171696 A1 Jul. 26, 2007

(30) Foreign Application Priority Data
Dec. 19, 2005 (FR) .................................. 05 12871

(51) Int. Cl.
*G11C 11/34* (2006.01)
(52) U.S. Cl. .............................. 365/185.25; 365/185.22; 365/191
(58) Field of Classification Search ............ 365/185.25, 365/185.22, 191, 104, 185.23, 185.05, 230.08, 365/185.18
See application file for complete search history.

(56) References Cited

U.S. PATENT DOCUMENTS

| | | | |
|---|---|---|---|
| 5,804,996 A * | 9/1998 | Verhaeghe et al. | ............ 327/77 |
| 6,040,734 A | 3/2000 | Villa et al. | |
| 6,847,249 B1 | 1/2005 | Brokaw | |
| 2002/0024070 A1 | 2/2002 | Fournel | |
| 2002/0030515 A1 * | 3/2002 | Garnier | ........................ 327/63 |

OTHER PUBLICATIONS

French Search Report for FR 0512871 dated Sep. 14, 2006.

* cited by examiner

*Primary Examiner*—Dang T Nguyen
(74) *Attorney, Agent, or Firm*—Lisa K. Jorgenson; Bryan A. Santarelli; Graybeal Jackson LLP

(57) ABSTRACT

An embodiment of the invention pertains to an $n^{th}$ order selector switch device comprising: a first arm comprising n transistors series-connected between a first input to which a 0-ranking potential is applied, and an output; and a second arm comprising n transistors series-connected between a second input to which a 0-ranking potential is applied, and the output. The device according to the invention also comprises: a means to produce n−1 potentials ranked 1 to n−1 included between the potential ranked 0 and the potential ranked n; and a driving means for the production, from the n+1 potentials ranked 0 to n, of control signals suited to driving the gates of the transistors of the first arm and the gates of the transistors of the second arm so that the transistors of one of the arms are on and the transistors of the other arm are off depending on the value of the n-ranking potential relative to the value of the 0-ranking potential.

17 Claims, 4 Drawing Sheets

RECURSIVE DEVICE FOR SWITCHING OVER A HIGH POTENTIAL GREATER THAN A NOMINAL POTENTIAL OF A TECHNOLOGY IN WHICH THE DEVICE IS MADE AND RELATED SYSTEM AND METHOD

PRIORITY CLAIM

This application claims priority from French patent application No. 0512871, filed Dec. 19, 2005, which is incorporated herein by reference.

TECHNICAL FIELD

An embodiment of the invention relates to an nth order selector switch device comprising:
- a first input to which a 0-ranking potential is applied, a second input to which an n-ranking potential is applied and an output,
- a first arm comprising n series-connected transistors, a first transistor being connected to the first input and an $n^{th}$ transistor being connected to the output,
- a first arm comprising n series-connected transistors, a first transistor being connected to the second input and an $n^{th}$ transistor being connected to the output.

BACKGROUND

In an electronic component, a high programming potential is generally necessary, to program a storage cell for example. This high programming potential HV is greater than the normal potential VDD that can be supported by the component and is generally produced by a potential generator internal to the component, for example a charge pump type circuit which produces the high potential HV from the normal potential VDD. The presence of a high-potential generator is used especially by the user of the component to program the memory cells of the component by himself and hence parameterize the component alone.

However, charge pump type circuits may have low fan-out, i.e., they produce limited current at the output (the power of the circuit is naturally limited by the power given to the component), and the cells are therefore programmed one after the other; this programming sequence may be relatively lengthy, and may even be prohibitive when a large number of components are programmed, for example during the component-testing stages at the manufacturer's plant.

To overcome this difficulty, manufacturers generally plan for an additional power pin on the component, to enable direct power supply at high potential by an external source that is more powerful and more efficient than a charge pump type of internal circuit. Powering the component by means of an external source enables the parallel programming of a large number of storage cells. It then becomes feasible to program a large number of components in a reasonable amount of time.

If the component has both an external power supply pin and an internal high-potential power generator, a selector switch device is used for the selection of either the internal or the external high-potential power source.

FIG. 1 shows a prior-art selector switch device capable of supporting and switching over the high potentials applied to its terminal. The circuit of FIG. 1 has two arms each having n series-connected transistors, $M_0$, $M_2$, ..., $M_{2n-2}$ for one arm and $M_1$, $M_3$, ..., $M_{2n-1}$ for the other arm. The first arm is connected between a first input to which a potential HV0 is applied and an output of the selector switch device, and the second arm is connected between a second input to which a potential HV1 is applied and the output of the selector switch device at which HVout is produced.

Two bias circuits 10, 20 (also called "cascode-bias circuits") are used to control respectively the transistors of the first arm and the transistors of the second arm. The circuits 10, 20 are activated by external control signals. HV0 is for example a high potential given by an external source and HV1 is for example a high potential given by an internal source of the component. The selector switch device of FIG. 1 gives a potential HVout at its output. This potential HVout is equal either to the potential HV0 or to the potential HV1 depending on the external control signals.

In each arm, the transistors are transistors capable of taking a maximum voltage across their electrodes that is approximately equal to the nominal potential VDD of the component. The number n of transistors is chosen as a function of the potentials HV0, HV1 so as to distribute the voltage along the unselected arm of the selector switch device. The number n is thus of the order of (HV1—HV0)NDD in terms of absolute value. Further details on the making of the selector switch device of FIG. 1 are found in "A 5.5V SOPA Line Driver in a Standard 1.2V 0.13 μm CMOS Technology", Proceedings of ESSCIRC, Grenoble, France, 2005, which is incorporated by reference).

The device of FIG. 1 may have drawbacks. In particular, the device of FIG. 1 is efficient for switching over the potentials HV1, HV0 up to about 2*VDD, but it is no longer efficient if HV1, HV0 are greater than 2*VDD, because the bias circuits typically must switch over large numbers of cascade-connected transistors. Furthermore, the bias circuits 10, 20 may be difficult to make because they use complex circuits such as potential step-up circuits. Finally, the bias circuits must be controlled by external control signals and additional means may be needed to produce these signals.

SUMMARY

An embodiment of the invention is a novel selector switch device that may be simpler to implement and may not have the drawbacks of prior-art selector switch devices.

Such a selector switch device comprises:
- a means to produce n−1 potentials ranked 1 to n−1 ($V_{1,n-1}$, $V_{2,n-2}$, ..., $V_{i,n-i}$, ..., $V_{n-1,1}$) included between the potential ranked 0 and the potential ranked n,
- a driving means for the production, from the n+1 potentials ranked 0 to n, of control signals suited to driving the gates of the transistors of the first arm and the gates of the second arm so that the transistors of one of the arms are on and the transistors of the other arm are off depending on the value of the n-ranking potential relative to the value of the 0-ranking potential.

Thus, a device according to an embodiment of the invention does not need external control signals. Without external control, the driving means automatically switches over the transistors so as to connect either of the inputs to the output of the device, depending on the difference between the potentials applied to the inputs.

In one embodiment, the driving means includes a set of lower-than-n order selector switch devices, each comparing two potentials among the potentials ranked 0 to n, and each producing a control potential at its output that is the result of the comparison and is applied to a gate of a transistor of the first arm or to a gate of a transistor of the second arm.

Thus, as shall be seen more clearly here below, an embodiment of the $n^{th}$ order device comprises a set of lower-than-n order devices. It then becomes very easy to make higher-order devices by simple recurrence.

The number n is equal to $1+int(abs(V_{n,0}-V_{0,n})/(VDD+\epsilon))$, with:

$V_{0,n}$, the 0-ranking potential $V_{n,0}$, the n-ranking potential abs(x), the absolute value of x, for all x VDD, the nominal potential of the technology used to make the device, $\epsilon$, a very small and non-null number, and int(x), the integer part of x, for all x.

The product n*VDD indicates approximately the difference in potential $Abs(V_{n,0}-V_{0,n})$ that can be supported by the device between its inputs, it being known that all the elementary components of the device support at most the nominal potential VDD. The potentials $V_{n,0}$ and $V_{0,n}$ may on the contrary be greater than VDD or even greater than n*VDD.

In an embodiment of the invention, the transistors of the first arm, the transistors of the second arm and the transistors of the set of lower-than-n order selector switch devices are P type transistors, and the driving means produce control signals suited to driving the gates of the transistors of the first arm and of the second arm so that the output is connected to the input to which the greatest potential is applied. The device thus performs an $n^{th}$ order function $Max_n$ which produces the greatest of the potentials applied to its inputs at its output.

In an other embodiment of the invention, the transistors of the first arm, the transistors of the second arm and the transistors of the set of lower-than-n order selector switch devices are N type transistors, and the driving means produce control signals suited to driving the gates of the transistors of the first arm and of the second arm so that the output is connected to the input to which the smallest potential is applied. The device thus performs an $n^{th}$ order function $Min_n$ which produces the smallest of the potentials applied to its inputs at its output.

BRIEF DESCRIPTION OF THE DRAWINGS

Embodiments of the invention shall be understood more clearly and other features and advantages shall appear from the following description of examples of implementation of a selector switch device. The description, provided by way of an indication that in no way restricts the scope of the invention, is made with reference to the appended drawings, of which.

DETAILED DESCRIPTION

The selector switch devices according to an embodiment of the invention, whatever their order n, comprise:

a first input to which a 0-ranking potential referenced $V_{0,n}$ is applied, a second input to which an n-ranking potential referenced $V_{n,0}$ is applied, an output S;

a first arm comprising n transistors numbered $M_{n,0}$, $M_{n,2}$, ..., $M_{n,2n-2}$ (the first index indicates the number of transistors in an arm which is equal to the order of the device, the second index indicates the order of the transistor in the arm); a first transistor $M_{n,0}$ is connected to a first input and an $n^{th}$ transistor $M_{n,2n-2}$ is connected to the output S, a second arm comprising n transistors numbered $M_{n,1}$, $M_{n,3}$, ..., $M_{n,2-1}$; a first transistor $M_{n,1}$ is connected to the second input and an $n^{th}$ transistor $M_{n,2n-1}$ is connected to the output S.

All the devices of the invention also comprise:

a means to produce n−1 of the intermediate potentials ranked 1 to n−1, referenced $V_{1,n-1}, V_{2,n-2}, \ldots, V_{n-1,1}$ (the first index indicates the order of the potential in a series of potentials) included between the 0-ranking potential and the n-ranking potential, a driving means for the production, from the n+1 potentials ranked 0 to n, of control signals suited to driving the gates of the transistors of the first arm and the second arm so that the transistors of one of the arms are on and the transistors of the other arm are off depending on the value of the n-ranking potential relative to the value of the 0-ranking potential.

As numerical examples, the following two cases shall be considered:

first case: $V_{n,0}=n*VDD+VR$, $V_{0,n}=VR$ and the potentials ranked 1 to n−1 are regularly distributed between $V_{n,0}$ and $V_{0,n}$; in this case therefore we will have: $V_{1,n-1}=VDD+VR$, $V_{2,n-2}=2*VDD+VR$, ..., $V_{n-1,1}=(n-1)*VDD+VR$ second case: $V_{n,0}=VR$, $V_{0,n}=n*VDD+VR$, and the potentials ranked 1 to n−1 are regularly distributed between $V_{n,0}$ and $V_{0,n}$; in this case therefore we will have: $V_{1,n-1}=(n-1)*VDD+VR, V_{2,n-2}=(n-2)*VDD+VR, \ldots, V_{n-1,1}=VDD+VR$.

VR is any unspecified potential, which may correspond for example to a ground of the device. VR may also be greater than VDD or even greater than n*VDD.

For these numerical examples, the notation $V_{ij}$ indicates that, in the first case, $V_{ij}=i*VDD+VR$ and, in the second case, $V_{ij}=j*VDD+VR$.

First-order Devices

Figure 1:
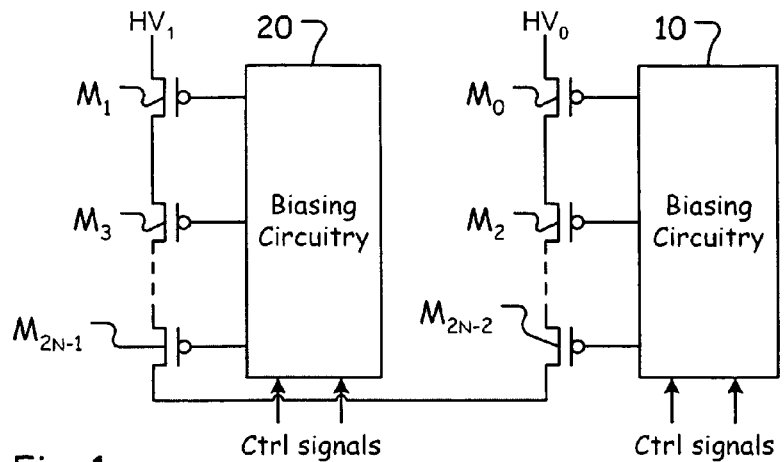
FIG. 1, already described, is a drawing of prior-art selector switch device.
Figure 2:
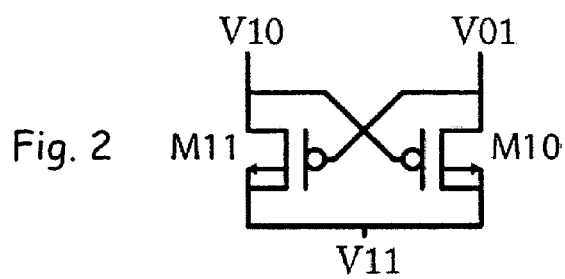
FIG. 2 is a drawing of a first-order selector switch device according to an embodiment of the invention.

A first-order selector switch device according to an embodiment of the invention receives potentials $V_{1,0}$ and $V_0$ at its inputs. The difference between the these potentials $V_{1,0}-V_{0,1}$ in terms of absolute value is at most of the order of the nominal potential VDD that can be supported by its elementary constituent components. The first-order selector switch device produces a potential $V_{1,1}$ equal either to the 0-ranking potential $V_{0,1}$, or to the 1-ranking potential $V_{1,0}$ as a function of the result and comparison of the potential $V_{0,1}$ with the potential $V_{1,0}$. As shown in FIG. 2, the first-order device comprises:

a first arm comprising a transistor $M_{1,0}$ connected firstly to the input $V_{0,1}$ and secondly to the output $V_{1,1}$, a second arm comprising a transistor $M_{1,1}$ connected firstly to the input $V_{1,0}$ and secondly to the output $V_{1,1}$, a means to apply the potential $V_{1,0}$ to a gate of the transistor $M_{1,0}$, said means being made here in the form of a connection between the input $V_{1,0}$ and the gate of the transistor $M_{1,0}$.

In an embodiment according to FIG. 2, the transistors $M_{1,0}$, $M_{1,1}$ are P type transistors and they are sized to support voltages or potentials of the order of VDD, variable for example according to the technology used to make the device. VDD is for example of the order of 2.5 V for a 50 angstrom oxide.

The device of FIG. 2 works as follows.

In the first numerical example, the potential $V_{1,0}$ is equal to VDD+VR and the potential $V_{0,1}$ is equal to VR.

A P type transistor is on if the difference between the potential applied to its source and the potential applied to its gate is greater than −VTP (VTP is a constant of the P type transistor that is well below VDD), giving Vsource−Vgate>−VTP. If not, the transistor is off. By way of an indication, VTP is of the order of −500 mV with 50 angstrom technology.

Here, the potential $V_{0,1}$, is applied to the source of the transistor $M_{1,0}$ and the potential $V_{1,0}$ is applied to its gate. Since $V_{0,1}-V_{1,0}=-VDD<-VTP$, $M_{1,0}$ is off.

In parallel, the potential $V_{1,0}$ is applied to the source of the transistor $M_{1,1}$, and the potential $V_{0,1}$, is applied to the gate of the transistor $M_{1,1}$. Since in this case $V_{1,0}-V_{0,1}=VDD>-VTP$, the transistor $M_{1,1}$, is on, and the potential at its drain is equal to $V_{1,0}$; the potential $V_{1,1}$ at the output S of the device is thus equal to $V_{1,0}$.

In the second numerical example, the potential $V_{1,0}$ is equal to VR and the potential $V_{0,1}$, is equal to VDD+VR. $M_{1,0}$ is then on and $M_{1,1}$, is off so that the potential $V_{1,1}$ at the output is equal to $V_{0,1}$. In other words, the potential $V_{1,1}$ at the output of the device is equal to the greatest of the potentials $V_{1,0}$, $V_{0,1}$ applied to its inputs $$V_{1,1} = Max_1(V_{1,0}, V_{0,1})$$

This relationship is valid whatever the values of the potentials $V_{1,0}$, $V_{0,1}$, provided that the difference $V_{1,0}-V_{0,1}$ in terms of absolute value is greater than −VTP. If the difference $V_{1,0}-V_{0,1}$ is lower than −VTP in terms of absolute value, then the transistors do not conduct in one arm or in the other, and in this case the output of the device is at high impedance. There should also be $Abs(V_{1,0}-V_{0,1})<VDD$.

In an other embodiment of a first-order selector switch device, a device almost in conformity with that of FIG. 2 is made by simply replacing the transistors $M_{1,0}$, $M_{1,1}$ by N type transistors also sized to support potentials and voltages of the order of VDD. An N type transistor is on if Vgate−Vsource>VTN (VTN is a constant of the N type transistor, that is well below VDD). Here, in the numerical examples chosen:

first example: $V_{1,0}=VDD+VR>V_{0,1}=VR$: the difference between the potential $V_{1,0}$ on the gate of $M_{1,0}$ and the potential $V_{0,1}$ present at its source is equal to VDD, greater than VTN, so that $M_{1,0}$ is on; conversely, the potential at the gate of $M_{1,1}$ is below the potential present at its source so that $M_{1,1}$ is off; from this we deduce: $V_{1,1}=V_{0,1}$ second example: $V_{1,0}=VR<V_{0,1}=VDD+VR$: similar reasoning leads to $V_{1,1}=V_{1,0}$ In other words, the potential $V_{1,1}$ at the output of the device comprising the N type transistors is equal to the smallest of the potentials $V_{1,0}$, $V_{0,1}$ applied to its inputs:

$$V_{0,0} = Min_1(V_{1,0}, V_{0,1})$$

This relationship is valid whatever the values of the potentials $V_{1,0}$, $V_{0,1}$, provided that the difference $V_{1,0}-V_{0,1}$ is greater, in terms of absolute value, than VTN. If the difference $V_{1,0}-V_{0,1}$ is smaller than VTN in terms of actual value, then the transistors cannot conduct and, in this case, the output of the device is at high impedance. There should also be Abs $(V_{1,0}-V_{0,1})<VDD$.

The device of FIG. 2 is called a first-order device because it receives potentials $V_{1,0}$, $V_{0,1}$ at its inputs. The difference between these potentials $V_{1,0}$, $V_{0,1}$ in terms of absolute value is of the order of the nominal potential VDD that can be supported by its constituent electronic components. It is noted that $V_{1,0}$ and/or $V_{0,1}$ may be greater or even far greater than VDD, the point being that their difference remains at most of the order of VDD. This results because the transistor that is off ($M_{1,0}$ or $M_{1,1}$ depending on the values of $V_{1,0}$, $V_{0,1}$) perceives the potential $V_{1,0}$ at one end of its drain/source channel and perceives the potential $V_{0,1}$ at the other end of its channel.

Second-order Devices

A second-order selector switch device according to an embodiment of the invention receives potentials $V_{0,2}$ and $V_{2,0}$ at its inputs. The difference between these potentials in terms of absolute value is, at the maximum, of the order of 2*VDD. The second-order selector switch device produces a potential $V_{2,2}$ equal either to the 0-ranking potential $V_{0,2}$ or to the 2nd-ranking potential $V_{2,0}$ as a function of the comparison of the potential $V_{0,2}$ with the potential $V_{2,0}$.

Figure 3:
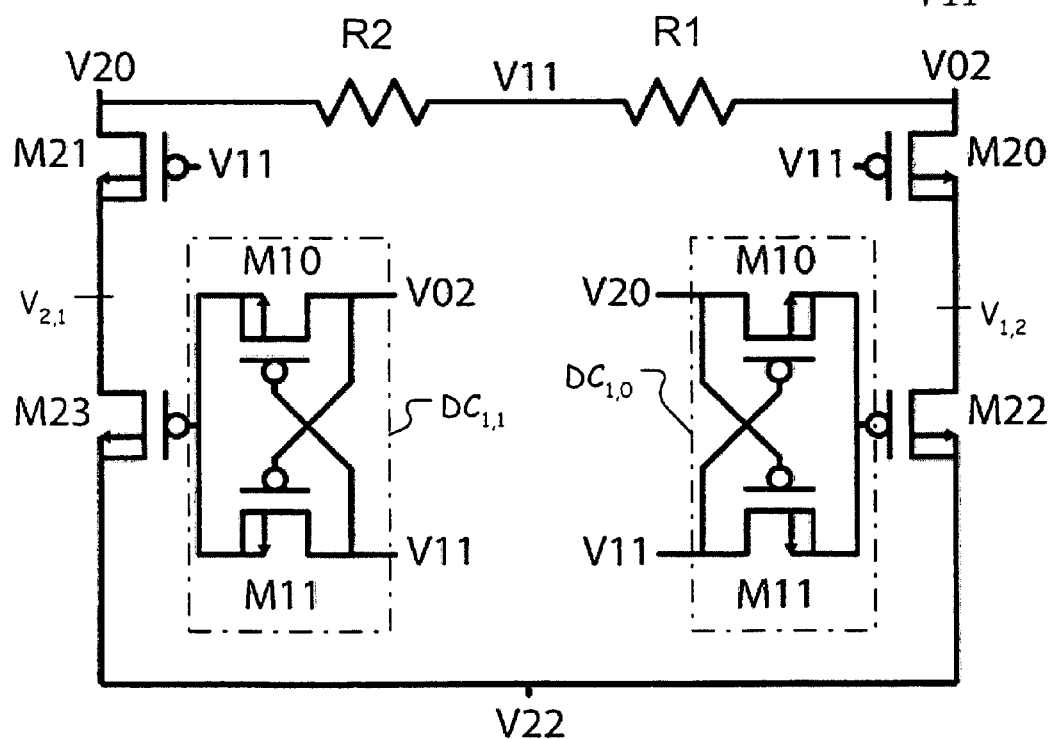
FIG. 3 is a drawing of a second-order selector switch device according to an embodiment of the invention.

An embodiment of a second-order device is in conformity with FIG. 3. It comprises a first arm having two series-connected transistors $M_{2,0}$, $M_{2,2}$, a first transistor $M_{2,0}$ connected to the first input $V_{0,2}$ and a second transistor $M_{2,2}$ connected to the output $V_{2,2}$.

The device of FIG. 3 also comprises a second arm having two series-connected transistors $M_{2,1}$, $M_{2,3}$, a first transistor $M_{2,1}$ connected to the second input $V_{2,0}$ and a second transistor $M_{2,3}$ connected to the output $V_{2,2}$.

The transistors of the first and second arms are capable of supporting potentials and voltages of a maximum value of the order of VDD. In the example of FIG. 3, the transistors are P type transistors.

The device of FIG. 3 also has a means to produce a potential $V_{1,1}$ ranked 1 between the potential $V_{0,2}$ ranked 0 and the potential $V_{2,0}$ ranked 2. In the example shown, said means has two resistors series-connected between the first input $V_{0,2}$ and the second input $V_{2,0}$. It is possible for example to choose R1 to be of the order of R2 so that, in terms of absolute value, $V_{2,0}-V_{1,1}$ is of the order of $V_{1,1}-V_{0,2}$.

The device of FIG. 3 also has a means to apply the potential $V_{1,1}$ ranked 1 to a gate of the transistor $M_{2,0}$; said means is a connection (not shown) between the common point of the resistors R1, R2 and the gate of the transistor $M_{2,0}$. Symmetrically, the device has a means to apply the potential $V_{1,1}$ ranked 1 to a gate of the transistor $M_{2,1}$; in the example, said means is a connection (not shown) between the common point of the resistors R1, R2 and the gate of the transistor $M_{2,1}$.

The device of FIG. 3 also has a first first-order selector switch device $DC_{1,0}$ compliant with the one shown in FIG. 2 and comprising a first input to which the potential $V_{2,0}$ is applied, a second input to which the potential $V_{1,1}$ is applied and an output connected to a gate of the transistor $M_{2,2}$. This first first-order device applies a potential equal to $V_{2,1}=Max_1(V_{2,0}, V_{1,1})$ to the gate of the transistor $M_{2,2}$.

Finally, the device of FIG. 3 has a second first-order selector switch device $DC_{1,1}$ compliant with the one shown in FIG. 2, comprising a first input to which the potential $V_{0,2}$ is applied, a second input to which the potential $V_{1,1}$ is applied and an output connected to a gate of the transistor $M_{2,3}$. This second first-order device applies a potential equal to $V_{1,2}=\text{Max}_1(V_{1,1}, V_{0,2})$ to the gate of the transistor $M_{2,3}$ The device of FIG. 3 works as follows:

In the first numerical example, the potential $V_{2,0}$ is of the order of 2*VDD+VR and the potential $V_{0,2}$ is equal to VR, and the resistors R1, R2 are equal (and hence $V_{1,1}$ is of the order of VDD+VR.

The potential $V_{2,0}$ is applied to the source of $M_{2,1}$ and the potential $V_{1,1}$ is applied to the gate of $M_{2,1}$. Since here $V_{2,0}-V_{1,1}=\text{VDD}>-\text{VTP}$, $M_{2,1}$ is on and the potential at the drain of $M_{2,1}$ and at the source of $M_{2,3}$ is equal to $V_{2,0}$. Since $V_{1,1}-V_{0,2}>-\text{VTP}$, the circuit $DC_{1,1}$ applies the potential $V_{1,2}$ to the gate of $M_{2,3}$, equal to $V_{1,2}=\text{Max}_1(V_{1,1},V_{0,2})=V_{1,1}$. Since here $V_{2,0}-V_{1,1}=\text{VDD} >-\text{VTP}$, $M_{2,3}$ is on and the potential $V_{2,2}=V_{2,0}$ appears at its drain, i.e. at the output $V_{2,2}$ of the device of FIG. 3.

The potential $V_{0,2}$ is applied to the source of $M_{2,0}$ and the potential $V_{1,1}$ is applied to the gate of $M_{2,0}$. Since here $V_{0,2}-V_{1,1}=-\text{VDD}$, $M_{2,0}$ is off. Furthermore, since $V_{2,0}-V_{1,1}=\text{VDD}$, the potential applied to the gate of $M_{2,2}$ is equal to $\text{Max}(V_{2,0}, V_{1,1})=V_{2,0}$. $M_{2,2}$ is also off. The common point of the transistors $M_{2,0}$, $M_{2,2}$ gets set at $V_{1,2}$.

We therefore have, in this first example: $V_{2,2}=V_{2,0}$.

In the second numerical example, the potential $V_{2,0}$ is of the order of VR, the potential $V_{0,2}$ is of the order of 2*VDD+VR, the resistors R1, R2 are of equal value (and therefore $V_{1,1}$ is of the order of VDD+VR.

It is soon noted that, in this case:

the potential at the gate of $M_{2,2}$ is equal to $\text{Max}_1(V_{2,0}, V_{1,1})=V_{1,1}=\text{VDD}+\text{VR}$ the potential at the gate of $M_{2,3}$ is equal to $\text{Max}_1(V_{1,1}, V_{0,2})=V_{0,2}=2*\text{VDD}+\text{VR}$.

$M_{2,0}$, $M_{2,2}$ are on, and $M_{2,1}$, $M_{2,3}$ are off so that $V_{2,2}=V_{0,2}=2*\text{VDD}+\text{VR}$ the common point of the transistors $M_{2,0}$, $M_{2,2}$ is at $V_{0,2}$ and the common point of the transistors $M_{2,1}$, $M_{2,3}$ is at $V_{2,1}$.

Thus, in this second example, we have $V_{2,2}=V_{0,2}$.

In other words, the device of FIG. 3 performs the following function whatever the values of the potentials $V_{2,0}$, $V_{0,2}$:

$$V_{2,2}=\text{Max}_2(V_{2,0}, V_{0,2}) \text{ for } 2*VTP<abs(V_{2,0}-V_{0,2})<2*VDD$$

The device of FIG. 3 is called a second-order device because it can accept potentials at its inputs whose difference is of the order of twice the nominal potential VDD supported by its constituent electronic components. Each arm has two series-connected transistors so that the arm that is off can support, between its ends, at most twice the potential VDD supported by the transistors.

The second-order device uses two first-order devices, $DC_{1,0}$ and $DC_{1,1}$.

Another embodiment of a second-order device is quasi-compliant with the device of FIG. 3 and is made by simply replacing all the P type transistors of the device of FIG. 3, including the transistors of the first-order devices $DC_{1,0}$ and $DC_{1,1}$ by N type transistors.

As seen here above, the first-order device comprising N type transistors performs a Minimum function; the device $DC_{1,0}$ will therefore apply a potential $\text{Min}_1(V_{2,0}, V_{1,1})$ to the gate of the transistor $M_{2,2}$ and the device $DC_{1,0}$ will apply a potential $\text{Min}_1(V_{1,1}, V_{0,2})$ to the gate of the transistor $M_{2,3}$.

The second-order selector switch device made out of N type transistors will thus produce a potential at its output equal to $\text{Min}_2(V_{2,0}, V_{0,2})$.

Third-order Devices

A third-order selector switch device according to the invention receives a third-ranking potential $V_{3,0}$ and a 0-ranking potential $V_{0,3}$ at its inputs E1, E2. The difference between these potentials $(V_{3,0}-V_{0,3})$ in terms of absolute value is, at the maximum, of the order of three times the nominal voltage VDD supported by its constituent elementary components. At its output S, the third-order selector switch device produces a potential $V_{3,3}$ equal either to the potential $V_{3,0}$ or to a potential $V_{3,0}$ depending on a comparison of the potential $V_{0,3}$ with the potential $V_{3,0}$.

Figure 4:
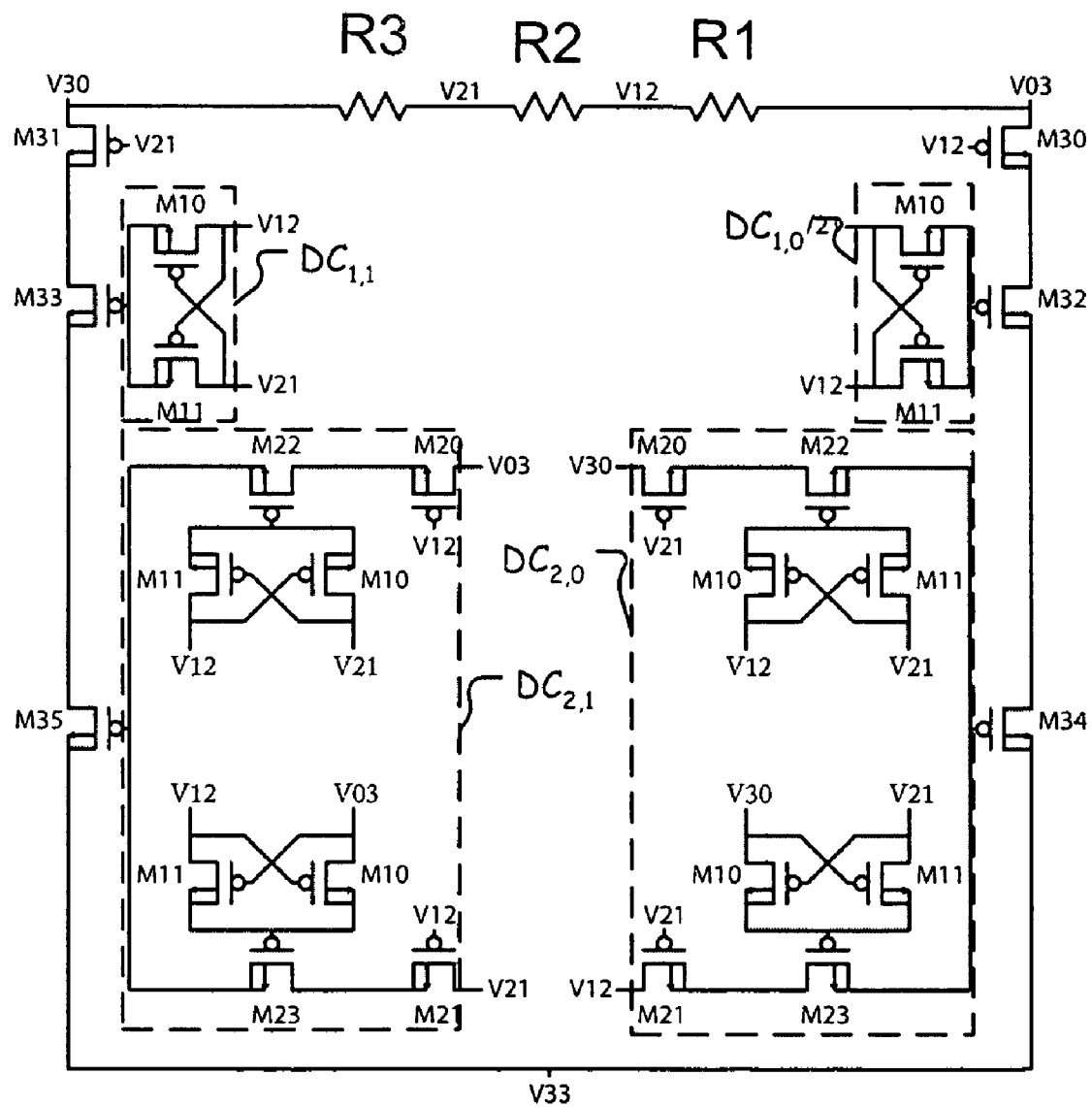
FIG. 4 is a drawing of a third-order selector switch device according to an embodiment of the invention.

An embodiment of a third-order device is in conformity with FIG. 4. It comprises:

a first arm having three series-connected transistors $M_{3,0}$, $M_{3,2}$, $M_{3,4}$, the first transistor $M_{3,0}$ being connected to the first input and the third transistor $M_{3,4}$ being connected to the output, a second arm having three series-connected transistors $M_{3,1}$, $M_{3,3}$, $M_{3,5}$, the first transistor $M_{3,1}$ being connected to the second input and the third transistor $M_{3,5}$ being connected to the output, a means to produce two potentials ranked 1 and 2, $V_{1,2}$ and $V_{2,1}$ between the potential $V_{0,3}$ ranked 0 and the potential $V_{3,0}$ ranked 3, a driving means comprising a set of lower-than-third order selector switch devices, each comparing two potentials of different ranks received at their inputs and producing a control potential at its output which is the result of the comparison applied to a gate of a transistor of the first arm or to a gate of a transistor of the second arm.

In the example of FIG. 4, the means to produce the potentials $V_{1,2}$ and $V_{2,1}$ ranked 1 and 2 is a set of resistors R1 to R3 series-connected between the first input and the second input.

In the example of FIG. 4 again, the driving means of the third-order device also has two second-order devices $DC_{2,0}$ and $DC_{2,1}$:

one of the devices $DC_{2,0}$ receives the potential $V_{3,0}$ ranked 3 and the potential $V_{1,2}$ ranked 1 at its inputs, and produces a potential equal to $V_{3,2}=\text{Max}_2(V_{1,2}, V_{3,0})$ at its output connected to the gate of the transistor $M_{3,4}$, the other device $DC_{2,1}$ receives the potential $V_{0,3}$ ranked 0 and the potential $V_{2,1}$ ranked 2 at its inputs, and produces a potential equal to $V_{2,3}=\text{Max}_2(V_{2,1}, V_{0,3})$ at its output connected to the gate of the transistor $M_{3,5}$, The driving means of the third-order device also has two first-order devices $DC_{1,0}$, $DC_1$:

one of them $DC_{1,0}$ receives the potential $V_{2,1}$ ranked 2 and the potential $V_{1,2}$ ranked 1 at its inputs and produces a potential equal to $V_{2,2}=\text{Max}_1(V_{1,2}, V_{2,1})$ at its output connected to the gate of the transistor $M_{3,2}$, the other device $DC_{1,1}$ receives the potential $V_{1,2}$ ranked 1 and the potential $V_{2,1}$ ranked 2 at its inputs and produces a potential equal to $V_{2,2}=\text{Max}_1(V_{2,1}, V_{1,2})$ at its output connected to the gate of the transistor $M_{3,3}$, Finally, the driving means applies the potential $V_{1,2}$ to the gate of the transistor $M_{3,0}$ and applies the potential $V_{2,1}$ to the gate of the transistor $M_{3,1}$.

At the drains of the transistors $M_{3,0}$, $M_{3,2}$, $M_{3,4}$ there respectively appear the potentials $V_{1,3}$, $V_{2,3}$ and $V_{3,3}$. At the drains of the transistors $M_{3,1}$, $M_{3,3}$, $M_{3,5}$ there appear the potentials $V_{3,1}$, $V_{3,2}$, $V_{3,3}$.

In the example of FIG. 4, the first-order and second-order devices are made in accordance with FIGS. 2 and 3. With a view to clarity, the inputs of the devices $DC_{1,0}$, $DC_{1,1}$, $DC_{2,0}$, $DC_{2,1}$ have not been shown nor have they been connected to the associated points of the resistive bridge. In practice, the first-order and second-order devices each receive two potentials to be compared, and at its output, each produces a result of the comparison. In the example of FIG. 4, the second-order devices also receive an intermediate-ranking potential ($V_{2,1}$ or $V_{1,2}$ as the case may be).

The device of FIG. 4 generally works as follows:

In the first numerical example, the potential $V_{3,0}$ is of the order of 3*VDD+VR, the potential $V_{0,3}$ is equal to VR, and the values of the resistors R1 to R3 are equal (and hence $V_{1,2}$ is of the order of VDD+VR and $V_{2,1}$ is of the order of 2*VDD+VR).

The potential $V_{1,2}$ is applied to the gate of the transistor $M_{3,0}$. and the potential $V_{0,3}$ is applied to its source. Since $V_{0,3}-V_{1,2}=-VDD<-VTP$, $M_{3,0}$ is off. The device $DC_{1,0}$ applies $V_{2,2}=Max_1(V_{2,1}, V_{1,2})=V_{2,1}$ to the gate of $M_{3,2}$ and the device $DC_{2,0}$ applies $V_{3,2}=Max_2(V_{3,0}, V_{1,2})=V_{3,2}$ to the gate of $M_{3,4}$. Since $V_{3,0}>V_{2,1}>V_{1,2}$, the transistors $M_{3,0}$, $M_{3,2}$, $M_{3,4}$ are all off and the potentials $V_{1,3}=V_{1,2}$, $V_{2,3}=V_{2,1}$, $V_{3,3}=V_{3,0}$ appear at their respective drains. The difference in potential between the ends of the first arm is distributed here among all the transistors that are off so that the difference in potential at the terminals of the channel of each transistor does not exceed VDD.

The potential $V_{2,1}$ is applied to the gate of the transistor $M_{3,1}$ and the potential $V_{3,0}$ is applied to its source. Since $V_{3,0}-V_{2,1}=VDD>VTP$, the transistor $M_{3,1}$ is on and the potential $V_{3,0}$ appears at its drain and hence also at the source of the transistor $M_{3,3}$. Furthermore, the device $DC_{1,1}$ applies $V_{2,2}=Max_1(V_{1,2}, V_{2,1})=V_{2,1}$ to the gate of $M_{3,3}$. Since $V_{3,0}-V_{2,1}=VDD>-VTP$, the transistor $M_{3,3}$ is also on and the potential $V_{3,0}$ appears at its drain and also at the source of the transistor $M_{3,5}$. The device $DC_{2,1}$ applies $V_{2,3}=Max_2(V_{0,3}, V_{2,1})=V_{2,1}$ to the gate of $M_{3,5}$. Since $V_{3,0}-V_{2,1}=VDD>-VTP$, the transistor $M_{3,5}$ is also on and the potential $V_{3,0}$ appears at its drain, so that the potential at the output of third-order device is equal to $V_{3,3}=V_{3,0}$.

In the second numerical example, the potential $V_{3,0}$ is of the order of VR, the potential $V_{0,3}$ is of the order of 3*VDD+VR, and the resistors R1 to R3 are of equal value (and hence $V_{1,2}$ is of the order of 2*VDD+VR and $V_{2,1}$ is of the order of VDD+VR).

The potential $V_{1,2}$ is applied to the gate of the transistor $M_{3,0}$. The device $DC_{1,0}$ applies $V_{2,2}=Max_1(V_{2,1}, V_{1,2})=V_{1,2}$ to the gate of $M_{3,2}$ and the device $DC_{2,0}$ applies $V_{3,2}=Max_2(V_{3,0}, V_{1,2})=V_{1,2}$ to the gate of $M_{3,4}$. Since the same potential $V_{1,2}$ is applied to the gates of the transistors $M_{3,0}$, $M_{3,2}$, $M_{3,4}$ of the first arm, since the same potential $V_{0,3}$ is present at the source of transistors of the first arm and since $V_{0,3}-V_{1,2}=VDD>VTP$, said transistors are all on, so that the potential $V_{3,3}$ at the output of the third-order device is equal to $V_{0,3}$.

The potential $V_{2,1}$ is applied to the gate of the transistor $M_{3,1}$ and the potential $V_{3,0}$ is applied to its source. Since $V_{3,0}-V_{2,1}=-VDD>-VTP$, $M_{3,1}$ is off. The device $DC_{1,1}$ applies $V_{2,2}=Max_1(V_{2,1}, V_{1,2})=V_{1,2}$ to the gate of $M_{3,3}$ and the device $DC_{2,1}$ applies $V_{3,2}=Max_2(V_{0,3}, V_{2,1})=V_{0,3}$ to the gate of $M_{3,5}$. Since $V_{0,3}>V_{1,2}>V_{2,1}$, the transistors $M_{3,1}$, $M_{3,3}$, $M_{3,5}$ are all off and the potentials $V_{3,1}=V_{2,1}$, $V_{3,2}=V_{1,2}$, $V_{3,3}=V_{0,3}$ appear at their respective drains. The difference in potential between the ends of the second arm is distributed here among all the transistors that are off so that the difference in potential at the terminals of the channel of each transistor does not exceed VDD.

$n^{th}$ Order Devices

The $1^{st}$, $2^{nd}$ and $3^{rd}$ order devices of FIGS. 2, 3 and 4 may be generalized to cover the case of any $n^{th}$ order device receiving at its inputs potentials $V_{n,0}$, $V_{0,n}$ whose difference $V_{n,0}-V_{0,n}$ in terms of absolute value is, at the maximum, of the order of n times the nominal potential VDD supported by its elementary constituent components.

Such an $n^{th}$ order device comprises:

a first arm comprising n series-connected transistors ($M_{n,0}$, $M_{n,2}$, ..., $M_{n,2n-2}$), the first transistor ($M_{n,0}$) being connected to the first input and the $n^{th}$ transistor ($M_{n,2n-2}$) being connected to the output, a second arm comprising n series-connected transistors ($M_{n,1}$, $M_{n,3}$, ..., $M_{n,2n-1}$) the first transistor ($M_{n,1}$) being connected to the first input and the $n^{th}$ transistor ($M_{n,2n-1}$) being connected to the output, a means to produce n−1 potentials ranked 1 to n−1 ($V_{1,n-1}$, $V_{2,n-2}$, ..., $V_{i,n-i}$, ..., $V_{n,1,1}$) included between the potential ($V_{0,n}$) ranked 0 and the potential ($V_{n,0}$) ranked n, a driving means comprising a set of lower-than-n order selector switch devices, each comparing two potentials of different ranks received at their inputs and producing a control potential at their outputs which is the result of the comparison and is applied to a gate of a transistor of the first arm or to a gate of a transistor of the second arm.

Figure 5:
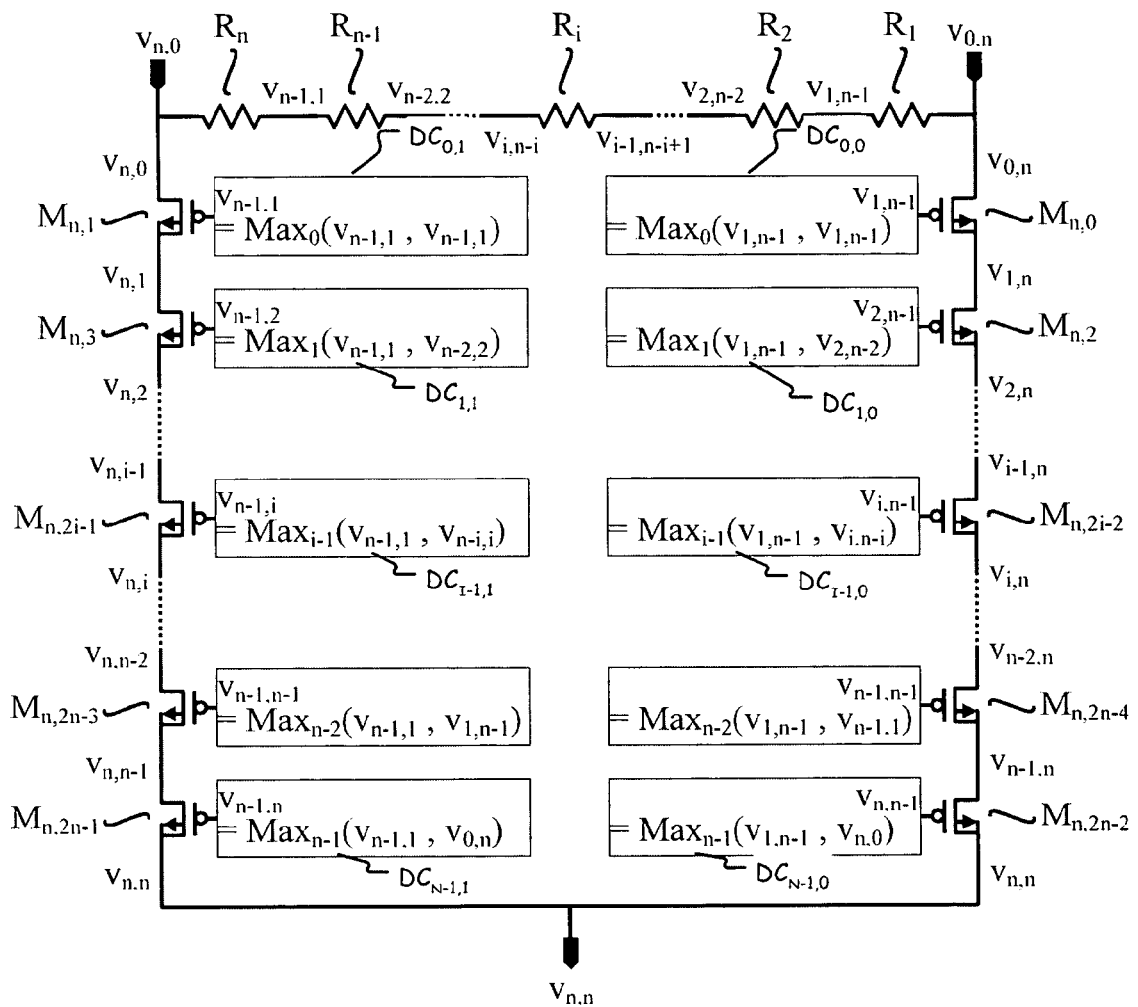
FIG. 5 is a drawing of an $n^{th}$-order selector switch device according to an embodiment of the invention.

An example of an $n^{th}$ order device such as this is shown schematically in FIG. 5. In this example, the transistors used are all P type transistors and the total device performs a function $V_{n,n}=Max_n(V_{n,0}, V_{0,n})$, $V_{0,n}$ and $V_{n,0}$ being the potentials applied to its first and second inputs, and $V_{n,n}$ being the potential that it produces at its output.

In the example of FIG. 5, the means for producing the potentials $V_{1,n-1}$ to $V_{n-1,1}$ ranked 1 to n−1 is a set of resistors R1 to Rn series-connected between the first input and the second input.

In the example of FIG. 5 again, the driving means of the $n^{th}$-order device comprises two devices $DC_{n-1,0}$, $DC_{n-1,1}$ of the $n^{th}$-order:

One of these devices $DC_{n-1,0}$ receives the potential $V_{n,0}$ ranked n and the potential $V_{1,n-1}$ ranked 1 and produces a potential equal to $Max_{n-1}(V_{1,n-1}, V_{n,0})$ at its output connected to the gate of the transistor $M_{n,2n-2}$; in the example, the device $DC_{n-1,0}$ also receives the potentials ranked between potential ranked 1 and the potentials ranked n as auxiliary potentials, The other device $DC_{n-1,1}$ receives the potential $V_{0,n}$ ranked 0 and the potential $V_{n-1,1}$ ranked n−1 and produces a potential equal to $Max_{n-1}(V_{n-1,1}, V_{0,n})$ at its output connected to the gate of the transistor $M_{n,2n-1}$; in the example, the device $DC_{n-1,1}$ also receives the potentials ranked between the potential ranked 0 and the potential ranked n−1 as auxiliary potentials.

The driving means of the $n^{th}$-order device also has two devices of the $n^{th}$-2 order, namely $DC_{n-2,0}$, $DC_{n-2,1}$:

One of these devices $DC_{n-2,0}$ receives the potential $V_{n-1,1}$ ranked n−1 and the potential $V_{1,n-1}$ ranked 1 at its inputs and produces a potential equal to $Max_{n-2}(V_{1,n-1}, V_{n-1,1})$ at its output connected to the gate of the transistor $M_{n,2n-4}$; in the example, the device $DC_{n-2,0}$ also receives the potentials ranked between the potential ranked 1 and the potential ranked n−1 as auxiliary potentials, the other device $DC_{n-2,1}$ receives the potential $V_{1,n-1}$ ranked 1 and the potential $V_{n-1,1}$ ranked n−1 at its inputs and produces a potential equal to $Max_{n-2}(V_{n-1,1}, V_{1,n-1})$ at its output connected to the gate of the transistor $M_{n,2n-3}$; the device $DC_{n-2,1}$ also receives, in the example, the potentials ranked between the potential ranked 1 and the potential ranked n−1 as auxiliary potentials.

The driving means of the $n^{th}$-order device also has two i-1 order devices, $DC_{i-1,0}$ and $DC_{i-1,1}$:

one of these devices $DC_{i-1,0}$ receives the potential $V_{i,n-i}$ ranked i and the potential $V_{1,n-1}$ ranked 1 at its inputs and produces a potential equal to the greatest of the potentials applied to its inputs ($Max_{i-1}(V_{1,n-1}, V_{i,n-i})$) at its output connected to a gate of the i−1 ranked transistor $M_{n,2i-2}$ of the first arm; in the example, the device $DC_{i-1,0}$ also receives the potentials having a rank between the potential ranked 1 and the potential ranked i.

the other device $DC_{i-1,1}$ receives the potential $V_{n-i,i}$ ranked n−i and the potential $V_{n-1,1}$ ranked n−1 at its inputs and produces a potential equal to the greatest of the potentials applied to its inputs ($Max_{i-1}(V_{n-1,1}, V_{n-i,i})$) at its output connected to a gate of the i−1 ranked transistor $M_{n,2i-1}$ of the second arm; in the example, the device $DC_{i-1,1}$ also receives the potentials of a rank between the potential ranked n−i and the potential ranked n−1.

The driving means of the $n^{th}$-order device also has two first-order devices, $DC_{1,0}$ and $DC_{1,1}$, made according to the diagram of FIG. 2:

one of the devices $DC_{1,0}$ receives the potential $V_{2,n-2}$ ranked 2 and the potential $V_{1,n-1}$ ranked 1 at its inputs and produces a potential equal to $Max_1(V_{1,n-1}, V_{2,n-2})$ at its output connected to the gate of the transistor $M_{n,2}$, the other device $DC_{1,1}$ receives the potential $V_{n-2,2}$ ranked n−2 and the potential $V_{n-1,1}$ ranked n−1 at its inputs and produces a potential equal to $Max_1(V_{n-1,1}, V_{n-2,2})$ at its output connected to the gate of the transistor $M_{n,3}$.

The driving means of the $n^{th}$-order device finally comprises two 0-order devices:

one of them $DC_{0,0}$ receives the same potential $V_{1,n-1}$ ranked 1 at its inputs and produces a potential equal to $Max_0(V_{1,n-1}, V_{1,n-1})$ at its output connected to the gate of the transistor $M_{n,0}$, the other device $DC_{0,1}$ receives the same potential $V_{n-1,1}$ ranked n−1 at its inputs and produces a potential equal to $Max_0(V_{n-1,1}, V_{n-1,1})$ at its output connected to the gate of the transistor $M_{n,1}$.

The 0-order devices are, in practice, simple connections for the application of an appropriate potential, respectively $V_{1,n-1}$ and $V_{n-1,1}$ to the gates of the transistors $M_{n,0}$, $M_{n,1}$. The term used here is "0-order devices" simply with a view to not interrupting the recurrence that underlies the making of the $n^{th}$-order device.

The lower-than-n order devices are made on the basis of the same principle as the $n^{th}$-order devices, in using a set of lower-order devices in the same way.

It is noted that in FIG. 5, with a view to clarity, the inputs of the devices $DC_{1,0}, \ldots, DC_{n-1,1}$ have not been shown, nor have they been connected to the associated points of the resistive bridge.

At the drains of the transistors $M_{n,0}$, $M_{n,2}$, . . . , $M_{n,2n-2}$ of the first arm, there respectively appear the potentials $V_{1,n}$, $V_{2,n}$, . . . , $V_{n,n}$. At the drains of the transistors $M_{n,1}$, $M_{n,3}$, . . . , $M_{n,2n-1}$, of the second arm, there respectively appear the potentials $V_{n,1}$, $V_{n,2}$, $V_{n,3}$, . . . , $V_{n,n}$.

The device of FIG. 5 generally works as follows:

In a first numerical example, it is assumed that the potential $V_{n,0}$ is of the order of n*VDD+VR, that the potential $V_{0,n}$ is equal to VR, and the resistors R1 to Rn have equal values (and hence that $V_{1,n-1}$ is of the order of VDD+VR, . . . , $V_{i,n-i}$ is of the order of i*VDD+VR, . . . ).

The device $DC_{0,0}$ applies $V_{1,n-1} = Max_0(V_{1,n-1}, V_{1,n-1}) = V_{1,n-1}$ to the gate of the transistor $M_{n,0}$. The device $DC_{1,0}$ applies $V_{2,n-1} = Max_1(V_{1,n-1}, V_{2,n-2}) = V_{2,n-2}$ to the gate of the transistor $M_{n,2}$ . . . . The device $DC_{i-1,0}$ applies $V_{i,n-1} = Max_{i-1}(V_{1,n-1}, V_{i,n-i}) = V_{i,n-i}$ to the gate of the transistor $M_{n,2i-2}$ . . . . The device $DC_{n-2,0}$ applies $V_{n-1,n-1} = Max_{n-2}(V_{1,n-1}, V_{n-1,1}) = V_{n-1,1}$ to the gate of the transistor $M_{n,2n-4}$. The device $DC_{n-1,0}$ applies $V_{n,n-1} = Max_{n-1}(V_{1,n-1}, V_{n,0}) = V_{n,0}$ to the gate of the transistor $M_{n,2n-2}$.

Since $V_{n,0} > V_{n-1,1} > \ldots > V_{i,n-i} > \ldots > V_{2,n-2} > V_{1,n-1} > V_{0,n}$, the transistors $M_{n,0}$, $M_{n,2}$, . . . , $M_{n,2i-2}$, . . . , $M_{n,2n-2}$ are all off and the potentials $V_{1,n} = V_{1,n-1}$, $V_{2,n} = V_{2,n-2}$, . . . , $V_{i,n} = V_{i,n-i}$, $V_{n,n} = V_{n,0}$ appear at their respective drains. The difference in potential between the ends of the first arm is distributed here among all the transistors of the first arm that are off so that the difference in potential at the terminals of each transistor does not exceed VDD.

The device $DC_{0,1}$ applies $V_{n-1,1} = Max_0(V_{n-1,1}, V_{n-1,1}) = V_{n-1,1}$ to the gate of the transistor $M_{n,1}$. The device $DC_{1,1}$ applies $V_{n-1,2} = Max_1(V_{n-1,1}, V_{n-2,2}) = V_{n-1,1}$ to the gate of the transistor $M_{n,3}$ . . . . The device $DC_{i-1,1}$ applies $V_{n-1,i} = Max_{i-1}(V_{n-1,1}, V_{n-i,i}) = V_{n-1,1}$ to the gate of the transistor $M_{n,2i-1}$ . . . . The device $DC_{n-2,1}$ applies $V_{n-1,n-1} = Max_{n-2}(V_{n-1,1}, V_{1,n-1}) = V_{n-1,1}$ to the gate of the transistor $M_{n,2n-3}$. The device $DC_{n-1,1}$ applies $V_{n-1,n} = Max_{n-1}(V_{n-1,1}, V_{0,n}) = V_{n-1,1}$ to the gate of the transistor $M_{n,2n-1}$.

Since the same potential $V_{n-1,1}$ is applied to the gates of the transistors $M_{n,1}$, $M_{n,3}$, . . . , $M_{n,2n-1}$ of the second arm, and since this potential is sufficient to turn them all on, the potentials $V_{n,1}$, $V_{n,2}$, . . . , $V_{n,n-1}$, $V_{n,n}$ at their respective drains are all equal to $V_{n,0}$, so that the potential $V_{n,n}$ at the output of the $n^{th}$-order selector switch device is equal to $V_{n,0}$.

In a second numerical example, it is assumed that the potential $V_{n,0}$ is of the order of VR, that the potential $V_{0,n}$ is of the order of n*VDD+VR, and that the values of the resistors R1 to Rn are equal (and hence that $V_{1,n-1}$ is of the order of (n−1)*VDD+VR, . . . , $V_{i,n-i}$ is of the order of (n−i)*VDD+VR, . . . , $V_{n-1,1}$ is of the order of VDD+VR).

In this case, the transistors of the first arm are on and the transistors of the second arm are off. The potential $V_{n,n} = V_{0,n}$ appears at the output of the $n^{th}$-order device.

FIG. 5 shows the potentials to the gates and the drains of the transistors, according to the following convention:

$$V_{i,j} = i*VDD+VR \text{ if } V_{n,0} = n*VDD+VR \text{ and } V_{0,n} = VR$$

$$V_{i,j} = j*VDD+VR \text{ if } V_{n,0} = VR \text{ and } V_{0,n} = n*VDD+VR$$

We thus have, for example, at the gate of the transistor $M_{n,2i-2}$ the potential $V_{i,n-1} = Max_{i-1}(V_{1,n-1}, V_{i,n-i})$ that is:

$$V_{i,n-1} = i*VDD+VR \text{ if } V_{n,0} = n*VDD+VR \text{ and } V_{0,n} = VR$$
$$(M_{n,2i-2} \text{ off})$$

$$V_{i,n-1} = (n-1)*VDD+VR \text{ if } V_{n,0} = VR \text{ and } V_{0,n} = n*VDD+VR (M_{n,2i-1} \text{ on})$$

And, and at the drain of the transistor $M_{n,2i-2}$ we have the potential:

$$V_{i,n} = i*VDD+VR \text{ if } V_{n,0} = n*VDD+VR \text{ and } V_{0,n} = VR$$
$$(M_{n,2i-2} \text{ off})$$

$$V_{i,n} = n*VDD+VR \text{ if } V_{n,0} = VR \text{ and } V_{0,n} = n*VDD+VR$$
$$(M_{n,2i-2} \text{ on})$$

Variants

Variants of the general device of FIG. 5 may be envisaged.

In a variant, in replacing all the P type transistors of the device of FIG. 5 (including the transistors of the lower-than-n order devices, $DC_{0,0}, DC_{0,1}, \ldots, DC_{i-1,0}, DC_{i-1,1}, \ldots$) by N type transistors and in applying potentials of appropriate rank to the inputs of the lower-than-n order devices $DC_{0,0}$, $DC_{0,1}, \ldots, DC_{i-1,0}, DC_{i-1,1}, \ldots$, we obtain an $n^{th}$-order device that performs a Minimum function and thus produces, at its output, a potential $V_{0,0}$ equal to the smallest of the potentials applied to its inputs: $V_{0,0}=Min_n(V_{n,0}, V_{0,n})$.

In the embodiment of the invention described, the potentials ranked 1 to n−1 are produced from a bridge of series-connected resistors. Other approaches can be envisaged. It is possible for example to use a set of series-connected transistors or a set of series-connected diodes. More generally, any potential divider bridge can be used.

The device of FIG. 5 can be made whatever the value of n. The order of the device is raised (or lowered) simply by adding (or by removing) a transistor in each arm, adding (or removing) two lower-rank devices and adding (or removing) one resistor in the resistant bridge.

If n is great, it is possible if need be to make gradual-junction type P transistors which have better behavior under voltage at the reverse-biased junction between the N well and the P substrate on which they are made.

In practice, an $n^{th}$ order comprises around $3^n$ transistors. The size of a device therefore increases sharply with the rank of the device. To limit the size of the device ranked n, at least two variants of the device of FIG. 5 may be envisaged, independently of each other or in combination.

Figure 6:
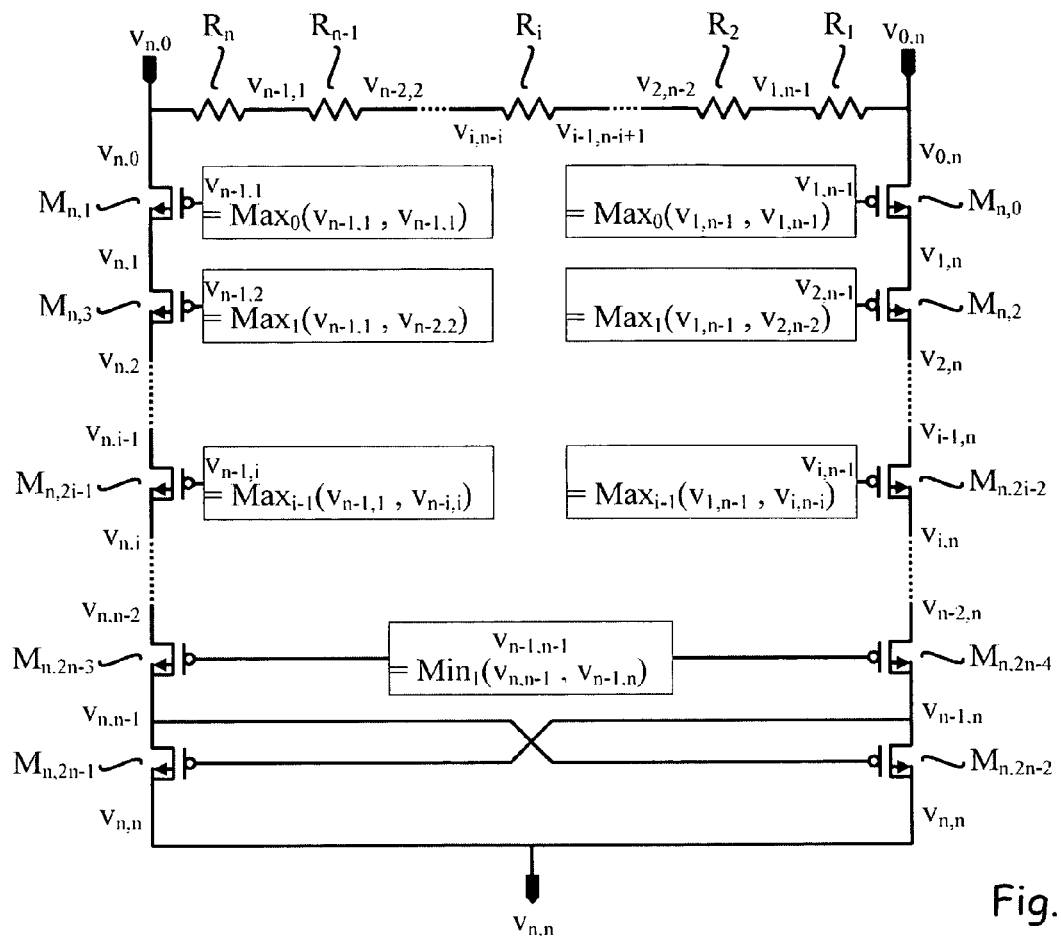
FIG. 6 is a variant of the drawing of FIG. 5 according to an embodiment of the invention.

These two variants are shown in FIG. 6.

In a first variant, the n−1 order devices $DC_{n-1,0}$ and $DC_{n-1,1}$, are eliminated, the gate of the transistor $M_{n,2n-2}$ is connected to the source of the transistor $M_{n,2n-1}$, and the gate of the transistor $M_{n,2n-1}$ is connected to the source of the transistor $M_{n,2n-2}$. This enables the elimination of transistors whose number is of the order of $2*3^{n-1}$ transistors. Both approaches are of course equivalent inasmuch as the following conditions are obtained, as can be seen in FIG. 5, and whatever the values of the potentials $V_{n,0}$ and $V_{0,n}$ the potential $V_{n,n-1}$ produced by the device $DC_{n-1,0}$ is equal to the potential $V_{n,n-1}$ present at the source of the transistor $M_{n,2n-1}$, and the potential $V_{n-1,n}$ produced by the device $DC_{n-1,1}$, is equal to the potential $V_{n-1,n}$ present at the source of the transistor $M_{n,2n-2}$.

In a second variant, all the devices ranked n−2 are replaced by a device ranked 1 of the $Min_1(V_{n,n-1}, V_{n-1,n})$ type. One input of this device is connected to the source of the transistor $M_{n,2n-1}$ (i.e. the common point of the transistors $M_{n,2n-3}$ and $M_{n,2n-1}$) to receive the potential $V_{n,n-1}$. The other input of this $Min_1(V_{n,n-1}, V_{n-1,n})$ type device is connected to the source of the transistor $M_{n,2n-2}$ (i.e. the common point of the transistors $M_{n,2n-4}$ and $M_{n,2n-2}$) to receive the potential $V_{n-1,n}$. The output of this $Min_1(V_{n,n-1}, V_{n-1,n})$ type device is connected to the gate of the transistor $M_{n,2n-3}$ and to the gate of the transistor $M_{n,2n-4}$. Thus, two devices ranked n−2, comprising $3^{n-2}$ order transistors, are each replaced by a device ranked 1 comprising only two transistors.

Figure 7:
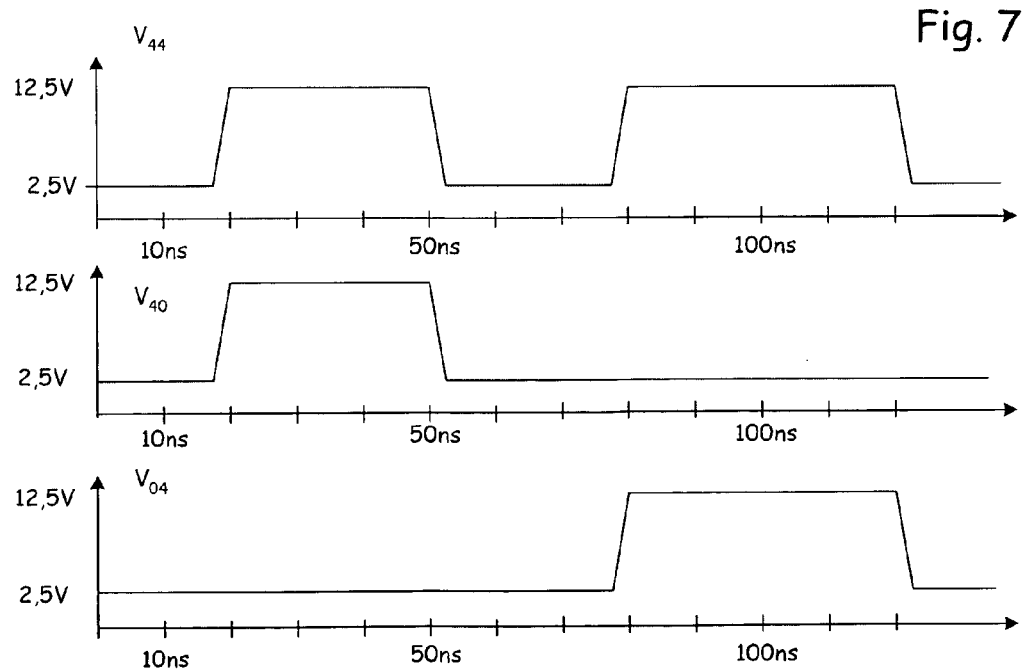
FIG. 7 is a timing diagram showing the evolution of the potentials at different points of a fourth-order device according to an embodiment of the invention.

FIG. 7 shows the progress, as a function of time, of the progress of the potentials $V_{4,4}$, $V_{4,0}$ and $V_{0,4}$, respectively at the output, the first input and the second input of a fourth-order device whose nominal potential is equal to VDD=2.5V.

It can clearly be seen that:

between about 20 and 50 ns, when $V_{0,4}$ is equal to VR=2.5V and $V_{4,0}$ is equal to 4*VDD+VR=12,5V, the potential at output is equal to $V_{4,4}=V_{4,0}$, and between about 80 and 120 ns, when $V_{0,4}$ is equal to 4*VDD+VR=12.5V and $V_{4,0}$ is equal to VR=2.5V, the potential at output is equal to $V_{4,4}=V_{0,4}$.

Thus, at output, the greatest of the potentials is truly applied to the inputs of the device, whether this greatest potential is applied to the first input or to the second input.

One or more of the above-described selection switches may be included in an integrated circuit having programmable memory cells, and such an integrated circuit may be incorporated in an electronic system such as a computer system.

From the foregoing it will be appreciated that, although specific embodiments of the invention have been described herein for purposes of illustration, various modifications may be made without deviating from the spirit and scope of the invention.

What is claimed is:

1. A signal-selection circuit, comprising:

first and second input nodes operable to respectively receive first and second signals respectively having first and second levels;

an output node operable to provide the one of the first and second signals having a predetermined relationship to the other of the first and second signals;

first and second switches serially coupled between the first input node and the output node and each having a respective control node, the first switch closest to the first input node, the control node of the first switch operable to receive a third signal having a third level that is between the first and second levels;

third and fourth switches serially coupled between the second input node and the output node and each having a respective control node, the third switch closest to the second input node, the control node of the third switch operable to receive a fourth signal having a fourth level that is between the first and second levels;

a first comparator operable to couple to the control node of the second switch the one of the second and third signals having the predetermined relationship to the other of the second and third signals; and a second comparator operable to couple to the control node of the fourth switch the one of the first and fourth signals having the predetermined relationship to the other of the first and fourth signals.

2. The signal-selection circuit of claim 1 wherein the first, second, third, and fourth levels are respective first, second, third, and fourth voltage levels.

3. The signal-selection circuit of claim 1 wherein:

the output node is operable to provide the one of the first and second signals that is greater than the other of the first and second signals;

the first comparator is operable to couple to the control node of the second switch the one of the second and third signals that is greater than the other of the second and third signals; and the second comparator is operable to couple to the control node of the fourth switch the one of the first and fourth signals that is greater than the other of the first and fourth signals.

4. The signal-selection circuit of claim 1 wherein:

the output node is operable to provide the one of the first and second signals that is less than the other of the first and second signals;

the first comparator is operable to couple to the control node of the second switch the one of the second and third signals that is less than the other of the second and third signals; and the second comparator is operable to couple to the control node of the fourth switch the one of the first and fourth signals that is less than the other of the first and fourth signals.

5. The signal-selection circuit of claim 1 wherein the first, second, third, and fourth switches each comprise a respective PMOS transistor.

6. The signal-selection circuit of claim 1 wherein the first, second, third, and fourth switches each comprise a respective NMOS transistor.

7. The signal-selection circuit of claim 1 wherein the fourth level equals the third level.

8. The signal-selection circuit of claim 1 wherein absolute values of respective differences between consecutive ones of the first, second, third, and fourth signal levels are each no greater than a predetermined value.

9. The signal-selection circuit of claim 1, further comprising:
a fifth switch serially coupled between the first and second switches and having a control node;
a sixth switch serially coupled between the third and fourth switches and having a control node;
a third comparator operable to couple to the control node of the fifth switch the one of the third and fourth signals having the predetermined relationship to the other of the third and fourth signals; and
a fourth comparator operable to couple to the control node of the sixth switch the one of the third and fourth signals having the predetermined relationship to the other of the third and fourth signals.

10. The signal-selection circuit of claim 1, further comprising:
a fifth switch serially coupled between the first and second switches and having a control node;
a sixth switch serially coupled between the third and fourth switches and having a control node; and
a third comparator operable to couple to the control nodes of the fifth and sixth switches the one of the third and fourth signals having the predetermined relationship to the other of the third and fourth signals.

11. A signal-selection circuit, comprising:
first and second input nodes operable to respectively receive first and second signals respectively having first and second levels;
an output node operable to provide the one of the first and second signals having a first predetermined relationship to the other of the first and second signals;
first and second switches serially coupled between the first input node and the output node and each having a respective control node, the first switch closest to the first input node, the control node of the first switch operable to receive a third signal having a third level that is between the first and second levels;
third and fourth switches serially coupled between the second input node and the output node and each having a respective control node, the third switch closest to the second input node, the control node of the third switch operable to receive a fourth signal having a fourth level that is between the first and second levels, the control node of the fourth switch coupled to a first tap node disposed between the first and second switches; and
wherein the control node of the second switch is coupled to a second tap node disposed between the third and fourth switches.

12. The signal-selection ciruit of claim 11, further comprising:
a fifth switch serially coupled between the first switch and the first tap node and having a control node;
a sixth switch serially coupled between the third switch and the second tap node having a control node;
wherein the first tap node carries a first tap signal and the second tap node carries a second tap signal; and
a comparator operable to couple to the control nodes of the fifth and sixth transistors the one of the one of the first and second tap signals having a second predetermined relationship to the other of the first and second tap signals.

13. The signal-selection circuit of claim 12 wherein:
the output node is operable to provide the greater one of the first and second signals; and
the comparator is operable to couple to the control nodes of the fifth and sixth transistors the lesser one of the one of the first and second tap signals.

14. An electronic system, comprising: an integrated circuit including a signal-selection circuit that comprises,
first and second input nodes operable to respectively receive first and second signals respectively having first and second levels,
an output node operable to provide the one of the first and second signals having a predetermined relationship to the other of the first and second signals,
first and second switches serially coupled between the first input node and the output node and each having a respective control node, the first switch closest to the first input node, the control node of the first switch operable to receive a third signal having a third level that is between the first and second levels,
third and fourth switches serially coupled between the second input node and the output node and each having a respective control node, the third switch closest to the second input node, the control node of the third switch operable to receive a fourth signal having a fourth level that is between the first and second levels,
a first comparator operable to couple to the control node of the second switch the one of the second and third signals having the predetermined relationship to the other of the second and third signals, and
a second comparator operable to couple to the control node of the fourth switch the one of the first and fourth signals having the predetermined relationship to the other of the first and fourth signals.

15. The electronic system of claim 14, further comprising a controller coupled to the integrated circuit.

16. The electronic system of claim 14 wherein the integrated circuit comprises an electrically programmable memory cell coupled to the output node of the signal-selection circuit.

17. An electronic system, comprising: an integrated circuit including a signal-selection circuit that comprises,
first and second input nodes operable to respectively receive first and second signals respectively having first and second levels,
an output node operable to provide the one of the first and second signals having a first predetermined relationship to the other of the first and second signals,
first and second switches serially coupled between the first input node and the output node and each having a respective control node, the first switch closest to the first input node, the control node of the first switch operable to receive a third signal having a third level that is between the first and second levels, third and fourth switches serially coupled between the second input node and the output node and each having a respective control node, the third switch closest to the second input node, the control node of the third switch operable to receive a fourth signal having a fourth level that is between the first and second levels, the control node of the fourth switch coupled to a first tap node disposed between the first and second switches, and wherein the control node of the second switch is coupled to a second tap node disposed between the third and fourth switches.

* * * * *